US012751082B2

(12) United States Patent
Anderson et al.

(10) Patent No.: US 12,751,082 B2
(45) Date of Patent: Sep. 29, 2026

(54) STAGGERED PITCH STACKED VERTICAL TRANSPORT FIELD-EFFECT TRANSISTORS

(71) Applicant: International Business Machines Corporation, Armonk, NY (US)

(72) Inventors: Brent A. Anderson, Jericho, VT (US); Hemanth Jagannathan, Niskayuna, NY (US); Junli Wang, Slingerlands, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 1074 days.

(21) Appl. No.: 17/821,263

(22) Filed: Aug. 22, 2022

(65) Prior Publication Data

US 2024/0063223 A1 Feb. 22, 2024

(51) Int. Cl.
*H10D 84/90* (2025.01)

(52) U.S. Cl.
CPC ......... *H10D 84/907* (2025.01); *H10D 84/966* (2025.01)

(58) Field of Classification Search
None
See application file for complete search history.

(56) References Cited

U.S. PATENT DOCUMENTS

| | | | | |
|---|---|---|---|---|
| 3,648,131 | A | 3/1972 | Stuby | |
| 6,593,624 | B2 | 7/2003 | Walker | |
| 7,838,913 | B2 | 11/2010 | Cheng | |
| 8,723,268 | B2 | 5/2014 | Moroz | |
| 9,747,983 | B2 | 8/2017 | Widjaja | |
| 10,115,807 | B2 | 10/2018 | Zang | |
| 10,381,346 | B1 | 8/2019 | Zhang | |
| 2014/0077305 | A1* | 3/2014 | Pethe | H01L 21/76897 257/E21.409 |
| 2019/0181054 | A1 | 6/2019 | Hook | |
| 2019/0393342 | A1 | 12/2019 | Xie | |
| 2020/0066683 | A1* | 2/2020 | Kim | H10D 84/8311 |
| 2020/0144274 | A1* | 5/2020 | Rubin | H10D 84/038 |
| 2021/0296314 | A1* | 9/2021 | Kang | H10D 84/0195 |

FOREIGN PATENT DOCUMENTS

| | | | |
|---|---|---|---|
| CN | 119949043 | A | 5/2025 |
| EP | 4578041 | A1 | 7/2025 |
| WO | 2024/041858 | A1 | 2/2024 |

OTHER PUBLICATIONS

International Searching Authority, "Notification of Transmittal of the International Search Report and the Written Opinion of the International Searching Authority, or the Declaration", International application No. PCT/EP2023/071386, International Filing Date Aug. 2, 2023, Mailed on Oct. 31, 2023, 14 pages.

* cited by examiner

*Primary Examiner* — Hung K Vu
(74) *Attorney, Agent, or Firm* — Edward J. Wixted, III

(57) ABSTRACT

An approach forming semiconductor structure composed of a first plurality of vertical transport field-effect transistors in a lower semiconductor layer and a second plurality of vertical transport field-effect transistors in an upper semiconductor layer. The second plurality of vertical transport field-effect transistors is horizontally offset from the first plurality of vertical transport field-effect transistors by a horizontal distance that is one-half of a contacted gate pitch between adjacent vertical transport field-effect transistors in the same semiconductor layer.

19 Claims, 7 Drawing Sheets

Section X1-X1

Section X2-X2

Section X3-X3

Section Y2-Y2

Section Y1-Y1

1000A

1000B

900

1200A

1200B

1100

STAGGERED PITCH STACKED VERTICAL TRANSPORT FIELD-EFFECT TRANSISTORS

BACKGROUND OF THE INVENTION

The present invention relates generally to the field of semiconductor device technology and more particularly to vertical transport field-effect transistors formed in different semiconductor device layers and more particularly, to adjacent vertical transport field-effect transistors on different semiconductor layers that have a one-half gate contact pitch.

As continued pressure for increased semiconductor chip performance, while maintaining a similar semiconductor chip size drives more function and more semiconductor devices in each semiconductor chip, various avenues are being explored to provide more semiconductor chip functionality without impacting wafer utilization. One avenue to provide more semiconductor chip functionality and more semiconductor devices per chip is the stacking of semiconductor logic devices. Vertically stacking semiconductor devices has emerged as a commonly occurring practice, particularly in memory devices, to provide both better semiconductor device functionality as the semiconductor devices are closer together and to provide improved wafer utilization. The emerging practice of vertically stacking semiconductor logic devices with one high-performance semiconductor logic device directly over another semiconductor logic device can improve both semiconductor chip performance and provide effective wafer utilization.

SUMMARY

Embodiments of the present invention disclose a semiconductor structure with a first plurality of vertical transport field-effect transistors in a lower semiconductor layer and a second plurality of vertical transport field-effect transistors in an upper semiconductor layer where each of the second plurality of vertical transport field-effect transistors is horizontally offset from at least one of the first plurality of vertical transport field-effect transistors by a horizontal distance that is one-half of a contacted gate pitch between adjacent transistors in the same semiconductor layer. Embodiments of the present invention disclose a semiconductor structure where adjacent transistors of the second plurality of vertical transport field-effect transistors in the upper semiconductor layer are each horizontally spaced by a contacted gate pitch. Embodiments of the present invention provide straight, vertical contacts connecting the vertical transport field-effect transistors in the lower semiconductor layer to the interconnect wiring above the vertical transport field-effect transistors in the upper semiconductor layer. Providing straight, vertical gate contact in the lower semiconductor layer results in better electrical performance for the first vertical transport field-effect transistor in the lower semiconductor layer and provides a simpler manufacturing process to form the straight, vertical gate contacts without requiring a lateral etching process. Additionally, embodiments of the present invention provide a semiconductor structure where the first vertical transport field-effect transistor has a gate contact over active gate (COAG) that can reduce the cell area of the transistor.

Embodiments of the present invention disclose a semiconductor structure including a first vertical transport field-effect transistor in a lower semiconductor layer and a second vertical transport field-effect transistor in an upper semiconductor layer, where the second vertical transport field-effect transistor in the upper semiconductor layer is horizontally offset by one half of a contacted gate pitch from the first vertical transport field-effect transistor in the lower semiconductor layer. Embodiments of the present invention provide straight, vertical contacts connecting the vertical transport field-effect transistors in the lower semiconductor layer to the interconnect wiring above the vertical transport field-effect transistors in the upper semiconductor layer. Providing straight, vertical gate contact in the lower semiconductor layer results in better electrical performance for the first vertical transport field-effect transistor in the lower semiconductor layer and provides a simpler manufacturing process to form the straight, vertical gate contacts without requiring a lateral etching process. Furthermore, embodiments of the present invention provide the vertical transport field-effect transistors in the lower semiconductor layer with a first type field-effect transistor and the vertical transport field-effect transistors in the upper semiconductor layer with a second type field-effect transistor.

Embodiments of the present invention disclose a semiconductor structure with one or more vertical transport field-effect transistors in an upper semiconductor layer that are separated by one contacted gate pitch and one or more vertical transport field-effect transistors in a lower semiconductor layer that are also are separated by one contacted gate pitch. The vertical transport field-effect transistors in the lower semiconductor layer are a first type of field-effect device and the vertical field-effect transistors in the upper semiconductor layer are a second type of field-effect device. Embodiments of the present invention provide vertical transport field-effect transistors in the upper semiconductor layer are offset by one half of the contacted gate pitch from the vertical transport field-effect transistors in the lower semiconductor layer. Each of the vertical transport field-effect transistors has straight, vertical contacts connecting to interconnect wiring above the vertical transport field-effect transistors in the upper semiconductor layer. Embodiments of the present invention provide the straight, vertical contacts to each of the vertical transport field-effect transistors because the vertical transport field-effect transistors in the upper semiconductor layer are horizontally offset by 12 the contacted gate pitch from the vertical transport field-effect transistors in the lower semiconductor layer thereby allowing space between adjacent vertical transport field-effect transistors in the upper semiconductor layer that is directly above each of the vertical transport field-effect transistors in the lower semiconductor. Providing straight, vertical contacts from the vertical transport field-effect transistors improves manufacturing yields and improves the electrical performance of the vertical transport field-effect transistors. Additionally, embodiments of the present invention provide a semiconductor structure where the first vertical transport field-effect transistor has a gate contact over active gate (COAG) that can reduce the cell area of the transistor.

Embodiments of the present invention disclose a semiconductor structure with a first pair of vertical transport field-effect transistors in a lower semiconductor layer and a second pair of vertical transport field-effect transistors in an upper semiconductor layer, where each transistor of the second pair of vertical transport field-effect transistors in the upper semiconductor layer is horizontally offset by ½ of a contacted gate pitch from at least one vertical transport field-effect transistors in the lower semiconductor layer. Furthermore, embodiments of the present invention provide a semiconductor structure where the second pair of vertical transport field-effect transistors in the upper semiconductor layer are a first type field-effect transistor connected in series and the first pair of vertical transport field-effect transistors in the lower semiconductor layer are a second type field-effect transistor connected in parallel. Embodiments of the present invention provide the first pair of vertical transport field-effect transistors in the lower semiconductor layer and the second pair of vertical transport field-effect transistors that form a two input NOR circuit. Each of the vertical transport field-effect transistors in the lower semiconductor layer have straight, vertical contacts to an interconnect wire above the second pair of vertical transport field-effect transistors. The ability to provide straight, vertical contacts improves both the manufacturing process and the electrical performance of the vertical transport field-effect transistors when compared to conventional stacked vertical transport field-effect transistors requiring horizontal or lateral jogs to avoid the vertical transport field-effect transistor residing directly above each of the lower vertical transport field-effect transistors. Additionally, embodiments of the present invention provide a bottom conduction plane connecting to at least one of the first pair of vertical transport field-effect transistors in the lower semiconductor layer and a power rail above and connected to at least one of the second pair vertical transport field-effect transistors in the upper semiconductor layer. Providing contacts from the first pair of vertical transport field-effect transistors in the lower semiconductor layer to the bottom conduction plane and providing a connection from the second pair of vertical transport field-effect transistors in the upper semiconductor layer to the power rail improves the electrical performance of the vertical transport field-effect devices.

Embodiments of the present invention provide a semiconductor structure with a first pair of vertical transport field-effect transistors in a lower semiconductor layer and a second pair of vertical transport field-effect transistors in an upper semiconductor layer, where each of the second pair of vertical transport field-effect transistors in the upper semiconductor layer is horizontally offset by ½ of a contacted gate pitch from at least one vertical transport field-effect transistor in the lower semiconductor layer. Embodiments of the present invention provide the first pair of vertical field-effect transistor in the lower semiconductor layer are connected in series and the second pair of vertical transport transistors in the upper semiconductor layer are connected in parallel. Embodiments of the present invention provide the first pair of vertical transport field-effect transistors in the lower semiconductor layer and the second pair of vertical transport field-effect transistors that form a two input NAND circuit. Additionally, embodiments of the present invention provide straight, vertical contacts connecting the vertical transport field-effect transistors in the lower semiconductor layer to the interconnect wiring above the vertical transport field-effect transistors in the upper semiconductor layer. Providing straight, vertical gate contact in the lower semiconductor layer results in better electrical performance for the first vertical transport field-effect transistor in the lower semiconductor layer and provides a simpler manufacturing process to form the straight, vertical gate contacts without requiring a lateral etching process.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
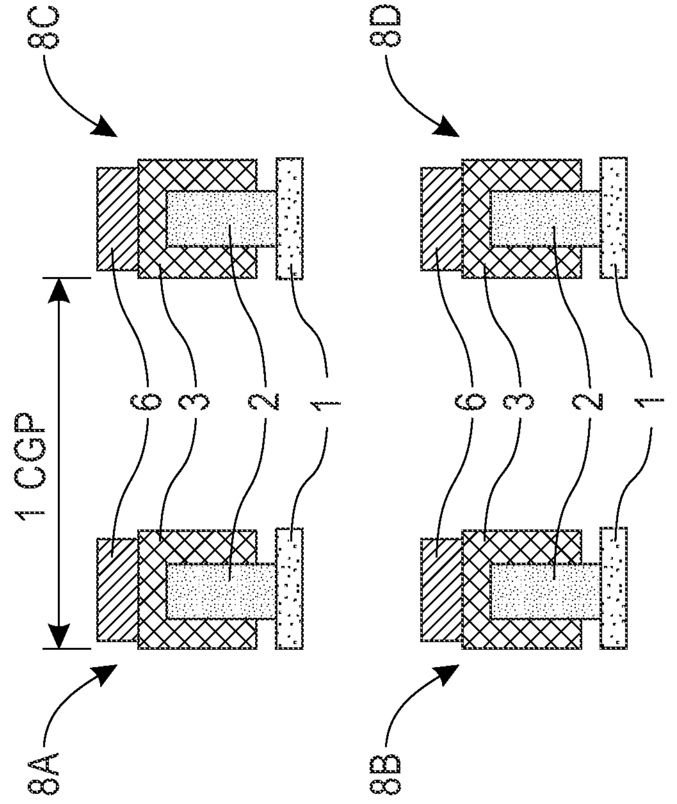
FIG. 1 Prior Art
FIG. 1 is a cross-sectional view of a semiconductor structure of conventionally vertically stacked vertical transport semiconductor devices in accordance with an embodiment of the present invention.

Embodiments of the present invention recognize that three-dimensional monolithic direct stacked vertical field-effect transistors (VTFETs) are typically devices including an n-channel FET (FET) and a p-channel FET (PFET). Embodiments of the present invention recognize that typically the stacked VTFETs are stacked directly above or below each other in different semiconductor layers to form the three-dimensional monolithic direct stacked VTFETs. Embodiments of the present invention recognize that in conventional, vertically stacked VTFETs, the pitch between gates in adjacent devices in the same semiconductor layer is commonly known as a contacted gate pitch (CGP) or a contact poly pitch (CPP). In the conventionally formed, vertically stacked VTFETs, the adjacent VTFETs residing in the same semiconductor have a pitch of one CGP between gates, and VTFETs that are directly above or below an adjacent VTFET in another semiconductor layer also have a horizontal gate to gate pitch of one CGP. Therefore, in convention, vertically stacked VTFETs, the horizontal distance between adjacent VTFETs in different semiconductor layers is also one CGP.

Embodiments of the present invention provide semiconductor structures with adjacent semiconductor devices in different semiconductor layers where the first semiconductor device in an upper semiconductor layer is horizontally separated or offset from a second semiconductor device in a lower semiconductor layer by a distance of one-half of the CGP. An alternative embodiment of the present invention provides semiconductor structures with adjacent semiconductor devices in different semiconductor layers where the first semiconductor device in an upper semiconductor layer is horizontally separated or offset from a second semiconductor device in a lower semiconductor layer by a distance in a range of 0.3 to 0.7 CGP. A horizontal distance between the first semiconductor device and a third semiconductor device in the same semiconductor layer is one CGP gate to gate. While embodiments of the present invention disclose the first semiconductor device and the second semiconductor device that are vertical transport field-effect (VTFET) devices, in other embodiments of the present invention, the first semiconductor device can be a memory device or another type of logic device and the second semiconductor device can be one of a memory device or a logic device.

Embodiments of the present invention further provide semiconductor structures with four or more VTFETs residing in two different semiconductor layers where each of the VTFETs residing in a lower semiconductor layer are horizontally distanced from each adjacent, upper VTFETs by one-half of the CGP. Alternative embodiments of the present invention further provide semiconductor structures with four or more VTFETs residing in two different semiconductor layers where each of the VTFETs residing in a lower semiconductor layer are horizontally distanced from each adjacent, upper VTFETs by a range of 0.3 to 0.7 of the CGP. Embodiments of the present invention provide four VTFET devices where the top two VTFET devices residing in an upper semiconductor layer and the bottom two VTFET devices in the lower semiconductor layer each have a CGP of 1 to adjacent VTFET devices in the same semiconductor layer. Embodiments of the present invention provide semiconductor structures with increased semiconductor device density when compared to conventional planar VTFET device layouts.

Embodiments of the present invention provide VTFET devices with a CGP of 1 in the same semiconductor layer but the VTFET devices in different semiconductor layers are offset by a smaller horizontal distance of ½ CGP from the VTFET devices that are in a different semiconductor layer that is above or below them. In this way, a VTFET device in a lower semiconductor layer is horizontally spaced by ½ CGP from an adjacent VTFET device in the upper semiconductor layer. Additionally, because the VTFET devices in the lower semiconductor layer are horizontally offset by ½ of the CGP from the VTFET devices in the upper semiconductor layer, the gate contacts from the lower VTFET devices can be formed with vertically etched vias to contact interconnect wiring structures or other semiconductor device elements formed above the upper VTFET devices. Embodiments of the present invention create straight, vertical gate contacts directly connecting with the semiconductor interconnect wiring or the semiconductor elements above the upper VTFET devices. The straight, vertical gate contacts that directly contact the interconnect wiring above the upper VTFET devices provide better electrical performance than gate contacts in conventional vertically stacked VTFET devices where the gate contact from the bottom VTFET devices must jog around the VTFET device directly above it to connect to the interconnect wiring above the upper VTFET devices. The straight, vertically etched gate contacts provided by embodiments of the present invention provide shorter signal paths without horizontal jogs connecting the lower VTFET devices to the interconnect wiring above the upper semiconductor devices.

Additionally, providing vertically etched vias forming the gate contacts reduces gate contact formation steps as compared to conventional vertically stacked VTFET devices where horizontal and lateral etching may be needed to form gate contacts with jogs for a path around the upper VTFET devices directly above each of the lower VTFET devices. Therefore, in addition to providing an improved electrical performance of the lower VTFET devices compared to conventional vertically stacked VTFET devices, embodiments of the present invention provide semiconductor structures and a method of forming the semiconductor structures that improve manufacturing yields (e.g., requires less gate contact formation processes). Using a vertical etching process to form gate contacts from the bottom VTFET devices connecting to the interconnect wiring above the upper VTFET devices is easier than the semiconductor manufacturing processes used to form the bottom gate contacts in conventional vertically stacked VTFET devices. Conventional vertically stacked VTFET devices are typically formed using a lateral etching process and a vertical via etching process to form the bottom gate contacts that jog around the upper VTFET device directly over the lower VTFET device to connect to the interconnect wiring above the upper VTFET device. Furthermore, the straight, vertical gate contacts reduce wiring blockage above the bottom VTFET devices and provide more wiring capability above the fins in the bottom VTFET device compared to conventional, vertically stacked VTFETs where lateral elements or vias for the gate contact of the bottom VTFET devices create wiring blockages above the fin of the bottom VTFET devices.

Embodiments of the present invention also disclose an optional etch stop between a gate contact and either the top source/drain or gate of the VTFET devices. The optional etch stop provides an option for forming a larger top source/drain that can be used as an enlarged landing pad for the gate contact. The enlarged landing pad provides improved yields during gate contact formation.

Embodiments of the present invention also provide a semiconductor structure where the gate contact can be formed directly over the active area of the gate and fin in the channel region. As known to one skilled, in the art, forming the gate contact directly on the gate over the active area of the VTFET device is advantageous for device electrical performance.

Furthermore, embodiments of the present invention disclose a semiconductor structure composed of a two input NAND circuit formed by a pair of p-type (PFET) VTFET devices in an upper semiconductor layer that are connected in parallel above and offset by ½ CGP from a pair of n-type (NFET) VTFET devices in a lower semiconductor layer that are connected in series. Embodiments of the present invention disclose a semiconductor structure composed of a two input NOR circuit with the pair of PFET VTFET devices connected in series and two NFET VTFET devices connected in parallel. Embodiments of the present invention also disclose a single CGP stacked transistor inverter layout using two VTFET devices.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for semiconductor chips, and only so much of the commonly practiced process steps are included as are necessary for an understanding of the described embodiments. The figures represent cross-section portions of the semiconductor chip with one or more vertically stacked semiconductor devices after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of semiconductor structure 100 for conventional VTFET devices in accordance with an embodiment of the present invention. FIG. 1 is an illustration of a prior art arrangement of four vertically stacked VTFET devices where each of the adjacent VTFETs has a CGP of 1 to an adjacent VTFET in the same semiconductor layer. Additionally, each of the four vertically stacked VTFET devices (VTFET 8A-D) has a horizontal distance of one CGP to another adjacent VTFET in the same semiconductor layer. For example, VTFET 8A has a 1 CGP to the adjacent VTFET 8C and VTFET 8B has a 1CGP to the adjacent VTFET 8D. Additionally, each of the four vertically stacked VTFET devices (VTFET 8A-D) has a horizontal distance of one CGP to another adjacent VTFET in the semiconductor layer above or below. For example. VTFET 8A has a 1 CGP to the adjacent VTFET 8D in the semiconductor layer below and VTFET 8C has a 1CGP to the adjacent VTFET 8B in the semiconductor layer below.

As known to one skilled in the art, the gate contact pitch (CGP) is a distance between adjacent gates in two adjacent semiconductor devices, typically in the same semiconductor layer. In some cases, the CGP may be the same distance as the contact poly pitch (CPP). As depicted later, CGP can also be considered as the horizontal distance between fins under the gates that are in the same semiconductor layer. For the purposes of the present invention, CGP is also used for the horizontal distance gate to gate or fin to fin for semiconductor devices residing in different semiconductor layers.

As depicted, FIG. 1 includes VTFET 8A, VTFET 8B, VTFET 8C, and VTFET 8D. In FIG. 1, VTFET 8A and VTFET 8C reside in the same upper semiconductor layers and have a contacted gate pitch or CGP of one (i.e., the horizontal distance gate to gate on adjacent devices). In FIG. 1, each of VTFET 8A, 8B, 8C, and 8D are composed of source/drain (S/D) 1, fin 2, gate 3, and gate contact 6. VTFET 8B and VTFET 8D reside in the same lower semiconductor layer and also have a CGP of one between each other. As depicted in FIG. 1, VTFET 8A is vertically stacked directly above VTFET 8B and VTFET 8C is directly above VTFET 8D. As depicted in FIG. 1, the four conventional vertically stacked VTFETs are each directly above or below each other in the upper and lower semiconductor layers. As depicted in prior art FIG. 1, there is no horizontal offset or horizontal distance between VTFET 8A and VTFET 8B or VTFET 8C and VTFET 8D which are in different semiconductor layers (i.e., they are directly above or below each other).

Furthermore, in the four conventional, vertically stacked VTFET devices, VTFET 8B and VTFET 8D cannot have straight, direct vertical connections from gate contact 6 to any wiring level (not depicted in FIG. 1) that is above VTFET 8A or VTFET 8C due to the interference or physical blockage created by VTFET 8A or VTFET 8C, respectively. In conventional, vertically stacked VTFETs depicted in FIG. 1, if VTFET 8B and VTFET 8D are not connecting directly to the VTFET above them, gate contact 6 from VTFET 8B and VTFET 8D must have a jog or lateral extension (not shown) such as a horizontal via-like element that connects to a vertical portion of the gate contact in order to go around VTFET 8A or VTFET 8C, respectively to reach a wiring level (not depicted in FIG. 1) above VTFET 8A or VTFET 8C.

Figure 2A:
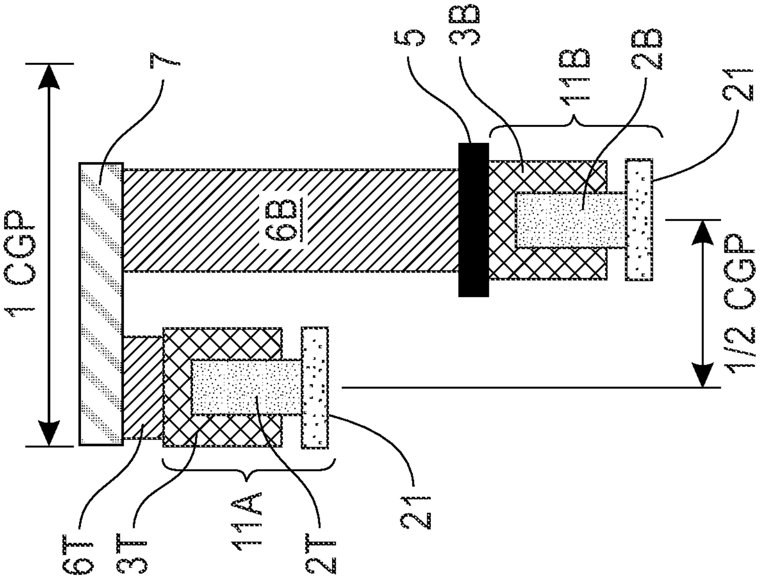
FIG. 2A is a cross-sectional view of a semiconductor structure after forming two stacked vertical transport field-effect transistors (VTFET) on different semiconductor structure layers with a half-pitch contacted gate pitch (CGP) offset in accordance with an embodiment of the present invention.

FIG. 2A is a cross-sectional view of semiconductor structure 200A after forming VTFET 11A and VTFET 11B in different semiconductor layers in accordance with an embodiment of the present invention. For the purposes of the present invention, the terms "CGP", and "pitch" can relate to the horizontal distance of adjacent VTFETs that are in the same semiconductor layer and the terms "offset", "stagger", and "CGP" can relate to the horizontal distance between VTFETs that are adjacent but residing in different semiconductor layers. As depicted, FIG. 2A includes VTFET 11A and VTFET 11B connected by back end of the line (BEOL) or middle of the line (MOL) interconnect wiring that is labeled interconnect wire 7.

In FIG. 2A, a CGP of one is depicted above wire 7 where the CGP of one would be to an adjacent VTFET (not depicted) in the same semiconductor layer. FIG. 2A also depicts the horizontal distance or offset as one-half of the CGP between VTFET 11A in the upper semiconductor layer and VTFET 11B in the lower semiconductor layer. As noted previously, in alternative embodiments the horizontal distance or offset may be 0.3 to 0.7 of the CGP between VTFET 11A in the upper semiconductor layer and VTFET 11B in the lower semiconductor layer. As illustrated in FIG. 2A, the 1% CGP for the horizontal distance between fin 2T and fin 2B would essentially be the same ½ CGP offset or stagger between the leftmost edges of gate 3T in VTFET 11A and the leftmost edges of gate 3B in VTFET 11B residing in different semiconductor layers or levels. VTFET 11A and VTFET 11B in different semiconductor layers have a ½ CGP stagger or horizontal offset that a horizontal distance from both fin 2T to fin 2B and from gate 3T to gate 3B.

In FIG. 2A, VTFET 11A includes at least bottom S/D 21, fin 2T, gate 3T, gate contact 6T connecting to a portion of interconnect wire 7, and VTFET 11B includes at least S/D 21, fin 2B, gate 3B, etch stop 5, gate contact 6B connecting to a portion of interconnect wire 7. In FIG. 2A, the two fins 2T and 2B each reside in a different semiconductor layer. As depicted in FIG. 2A, VTFET 11A is in a semiconductor layer that is above VTFET 11B. In an embodiment, the different semiconductor layers are adjacent to each other, and no other semiconductor devices reside between VTFET 11A and VTFET 11B. In various embodiments, VTFET 11A in a semiconductor layer above the semiconductor layer of VTFET 11B and VTFET 11A is horizontally offset from VTFET 11B by ½ CGP.

As depicted, semiconductor structure 200A also provides gate contacts 6T and 6B that can connect directly with interconnect wire 7 using a straight, vertically etched via hole or contact hole that is filled with metal to form gate contact 6B and gate contact 6T. In other words, by horizontally offsetting VTFET 11B by ½ CGP from VTFET 11A, gate contact 6B can connect directly using a vertically etched via with interconnect wire 7 without any horizontal jogs or additional horizontal wiring elements. In semiconductor structure 200A, using a vertically etched and filled gate contact via to form gate contact 6B provides advantages in both electrical performance (e.g., a shorter electrical path) and manufacturing yields (e.g., fewer processes and no lateral etching) when compared to conventional, vertically stacked VTFET devices requiring horizontal jogs to connect directly to an interconnect wire above an upper vertically stacked VTFET. As previously discussed, unlike VTFET 11B depicted in FIG. 2A, bottom VTFET 8B and VTFET 8D in FIG. 1 cannot connect directly with an interconnect wire above VTFET 8A or VTFET 8C using gate contact 6.

Additionally, the conventional vertically stacked VTFET devices depicted in FIG. 1 do not include etch stop 5 between gate 3B and gate contact 6B in VTFET 11B. As discussed in detail later, etch stop 5 is an optional VTFET element that aids in the formation of gate contact 6B in VTFET 11B.

While FIG. 2A depicts VTFET 11A and VTFET 11B, in other embodiments, VTFET 11A and VTFET 11B each could be another type of semiconductor device. For example, the semiconductor device in the location of VTFET 11A could be a memory device and the semiconductor device in the location of VTFET 11B could be another memory device or another logic device (e.g., a planar FET).

Figure 2B:
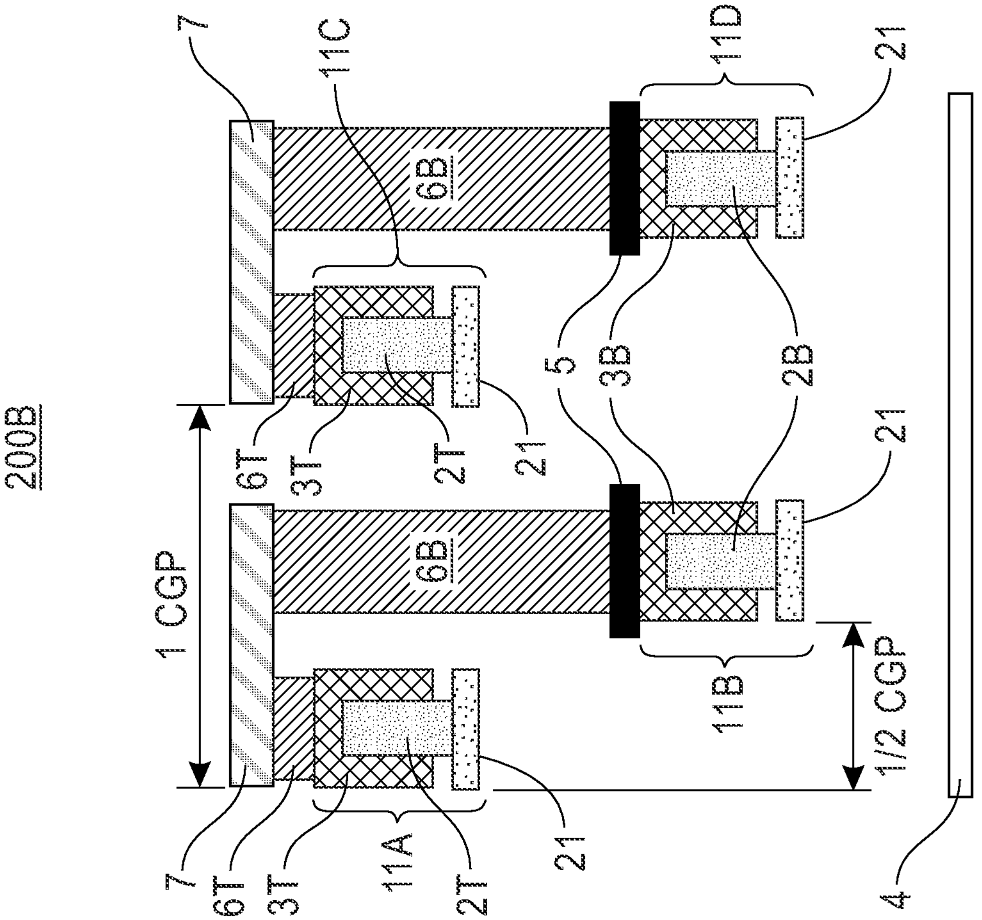
FIG. 2B is a cross-sectional view of a semiconductor structure with four stacked VTFETs where each top VTFET has a horizontal space of one half-CGP from an adjacent bottom VTFET in accordance with an embodiment of the present invention.

FIG. 2B is a cross-sectional view of semiconductor structure 200B with four VTFETs where VTFET 11A and VTFET 11C each have a horizontal distance of ½ CGP from an adjacent bottom VTFET 11B and VTFET 11D, respectively, in accordance with an embodiment of the present invention. As depicted, FIG. 2B includes ground 4, interconnect wires 7, VTFET 11A, VTFET 11B, VTFET 11C, and VTFET 11D where VTFET 11A and VTFET 11C are formed in semiconductor structure layers that are above the semiconductor structure layers of VTFET 11B and VTFET 11D. As depicted, a horizontal distance between VTFET 11A and VTFET 11B is ½ CGP.

In FIG. 2B, VTFET 11A and VTFET 11C each include one of bottom S/D 21, one of fin 2T, one of gate 3T, one of gate contact 6T connecting to interconnect wire 7, VTFET 11B and VTFET 11D that each include one of bottom S/D 21, one of fin 2B, one of gate 3B, one of etch stop 5, and one of gate contact 6B connecting to interconnect wire 7. As depicted, FIG. 2B includes four fins (e.g., two of fin 2T and two of fin 2B), and a VTFET is formed on each fin. For example, in FIG. 2B, gate contact 6T may provide input signals to gate 3T in VTFET 11A, and gate contact 6B may provide output signals to interconnect wire 7 although the location of signal inputs and outputs may be different in other examples. Interconnect wire 7 can be a wire in an interconnect wiring in either the middle of the line (MOL) or in a back end of the line (BEOL) interconnect wiring structure. As depicted in FIG. 2B, there are two portions of wire 7.

The top two devices, VTFET 11A and VTFET 11C are in a semiconductor layer or semiconductor level that is above and adjacent to the semiconductor layer with VTFET 11B and VTFET 11D (e.g., other semiconductor devices do not reside between VTFET 11A and VTFET 11B). Additionally, as depicted in FIG. 2B, VTFET 11A in the upper semiconductor layer has a 1 CGP pitch to VTFET 11C which is in the same semiconductor layer (the left edge of gate 3T in VTFET 11A is one CGP from the left edge of gate 3T in VTFET 11C). Similarly, VTFET 11B in the lower semiconductor layer as a CGP of one (not depicted in FIG. 2B) to VTFET 11D. For example, a CGP of 1 can typically range from 30 nm to 100 nm for advanced process nodes. In an exemplary example, as shown here, a CGP of 1 can be 40 nm. Also, depicted in FIG. 2B is a horizontal distance of ½ CGP between gate 3T in VTFET 11A and gate 3B in VTFET 11B which is in a lower semiconductor layer than VTFET 11A. For example, VTFET 11A in the upper level of semiconductor structure 200B and has horizontal distance (e.g., gate 3T to gate 3B) of 20 nm for the depicted ½ CGP distance from VTFET 11B to VTFET 11A but this horizontal distance or offset from VTFET 11A to VTFET 11B is not limited to 20 nm in other examples. Using the horizontal distances as labeled in FIG. 2B (i.e., ½ CGP and 1 CGP), VTFET 11B in the upper semiconductor layer has a horizontal distance or offset of ½ CGP from VTFET 11C in the lower semiconductor layer. In other words, each adjacent VTFET in FIG. 2B in a different layer of semiconductor structure 200B has a horizontal distance or offset of ½ CGP from each adjacent VTFET in another semiconductor layer and each adjacent VTFET in FIG. 2B in the same layer of semiconductor structure 200B has a horizontal distance or offset of 1 CGP. While FIG. 2B depicts two VTFETs in each semiconductor layer, in other examples, more than two VTFETs are present in each semiconductor layer.

Additionally, in various embodiments of the presentation invention, each of VTFET 11A, VTFET 11B, VTFET 11C, and VTFET 11D have straight, vertical gate contacts to wire 7 (i.e., each of gate contact 6T in VTFET 11A and VTFET 11C and gate contact 6B in VTFET 11C and VTFET 11D are straight, vertical connections to the interconnect wiring depicted as wire 7). As depicted in FIG. 2A, gate contact 6T and gate contact 6B do not require horizontal jogs or horizontal portions of gate contact 6B or 6T to connect to semiconductor features or wires above VTFET 11A or VTFET 11C. As previously discussed, straight, vertical gate contacts provide both improved electrical performance and improved manufacturing processes for the lower level VTFET 11B and VTFET 11D because lateral jogs or elements are not needed in the gate contacts of VTFET 11B and VTFET 11D.

Figure 3:
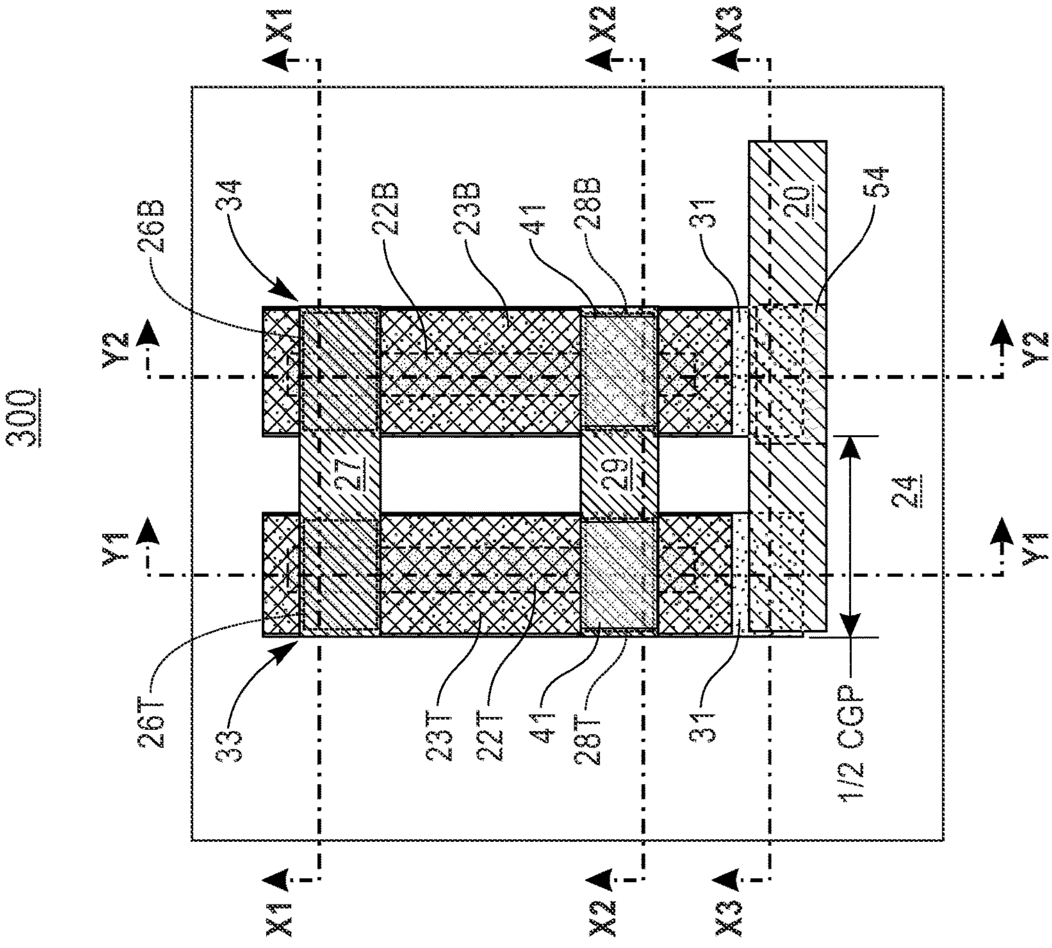
FIG. 3 is a top view of the semiconductor structure of an inverter formed using two stacked VTFETs with a half pitch CGP offset between the top VTFET and the bottom VTFET in accordance with an embodiment of the present invention.

FIG. 3 is an isometric top view 300 of the semiconductor structure forming a 1 CGP inverter with VTFET 33 and VTFET 34 in accordance with an embodiment of the present invention. As depicted, FIG. 3 includes Vdd 20, ground 24, ground connection 54, VTFET 33 with gate contact 26T and output connection 28T, VTFET 34 with gate contact 26B and output connection 28B, wire 27, and wire 29. VTFET 33 and VTFET 34 are each identified by an arrow. Additionally, FIG. 3 illustrates the locations of cross-sections X1-X1, X2-X2, X3-X3, Y1-Y1, and Y2-Y2 depicted later in FIG. 4 through FIG. 8. As known to one skilled in the art, an inverter is a NOT gate that flips the input, for example, from input 1 to output 0, or vice versa.

FIG. 3 illustrates VTFET 33 that is formed on fin 22T above and offset by ½ CGP from VTFET 34 on fin 22B. As illustrated in FIG. 3, the left edge of gates 23T on fin 22T of VTFET 33 in the upper semiconductor layers and the left edge of gate 23B on fin 22B in VTFET 34 are horizontally separated or offset by one half of the contacted gate pitch (e.g., ½ CGP). As depicted, VTFET 33 and VTFET 34 include bottom S/D 31 and top S/D 41. In various embodiments, VTFET 33 is an n-type field-effect (NFET) device and VTFET 34 is a p-type field-effect (PFET) device. In an embodiment, VTFET 33 is a PFET and VTFET is a NFET.

Figure 4:
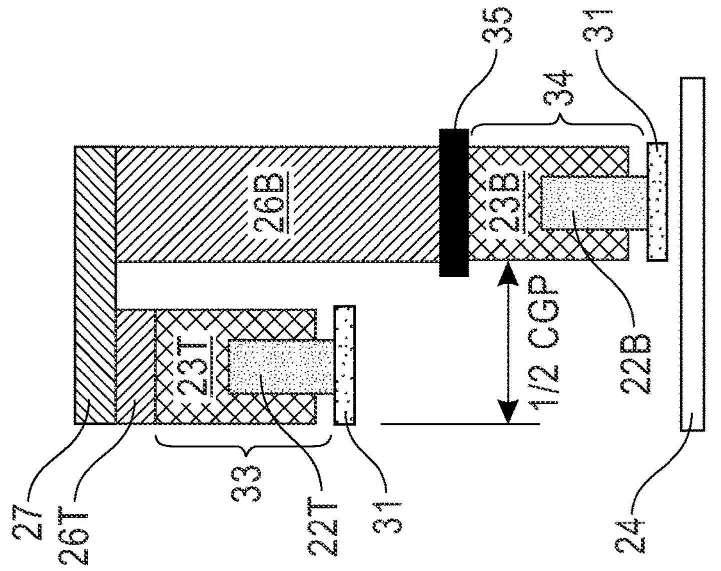
FIG. 4 is a cross-sectional view of the semiconductor structure through X1-X1 depicted in FIG. 3 in accordance with an embodiment of the present invention.

FIG. 4 is a cross-sectional view 400 through X1-X1 of the inverter illustrated in FIG. 3 in accordance with an embodiment of the present invention. As depicted, FIG. 4 includes ground 24, wire 27, VTFET 33, and VTFET 34 with gate contacts 26T and 26B, respectively. As depicted. fin 22B resides on a lower device layer of the semiconductor structure than fin 22T (e.g., the lower device layer is directly under the semiconductor layer of fin 22T without any additional semiconductor devices residing between VTFET 33 and VTFET 34). In semiconductor structure 400, VTFET 33 is adjacent to and above VTFET 34 where the horizontal distance or offset between VTFET 33 and VTFET 34 in the different semiconductor layer is one half of the CGP (e.g., where CGP of 1 would be the distance between gates in VTFETs in the same semiconductor layer).

As depicted in FIG. 4, VTFET 33 includes gate contact 26T connecting to wire 27, gate 23T on fin 22T where fin 22T resides on bottom S/D 31. As depicted, VTFET 34 includes bottom S/D 31, gate contact 26B, gate 23B on fin 22B, gate contact 26B connecting to wire 27 and etch stop 35. Etch stop 35 which is an optional element in VTFET 34 resides above gate 23B and under gate contact 26B. In some examples, (not depicted), etch stop 35 is not present in VTFET 34. In an embodiment, VTFET 33 is a PFET formed on fin 22T that can receive a signal from gate contact 26T and VTFET 34 is a NFET formed on fin 22B that can receive a signal from gate contact 26B.

Figure 5:
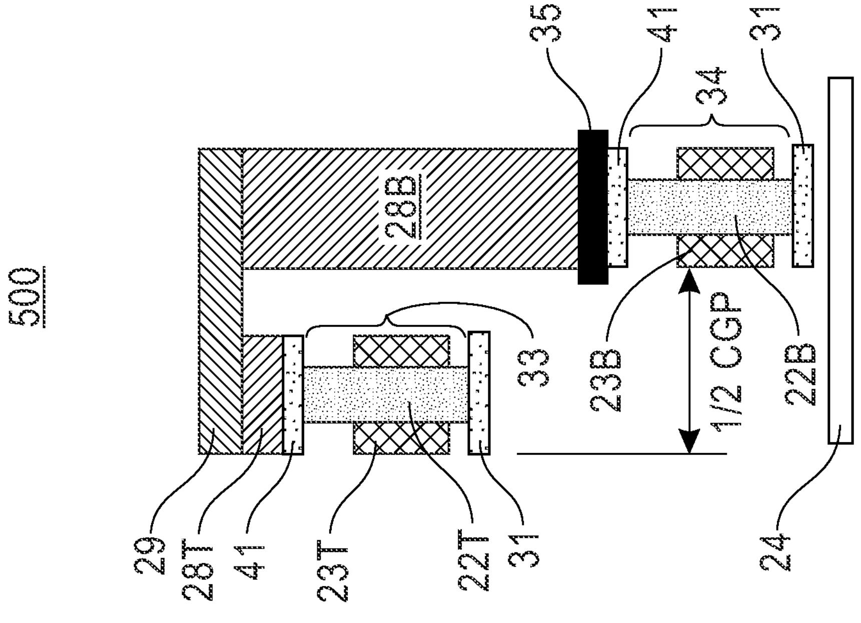
FIG. 5 is a cross-sectional view of the semiconductor structure through X2-X2 of the inverter depicted in FIG. 3 in accordance with an embodiment of the present invention.

FIG. 5 is a cross-sectional view 500 through X2-X2 of the inverter illustrated in FIG. 3 in accordance with an embodiment of the present invention. As depicted, FIG. 5 includes ground 24, wire 29, output connection 28T, output connection 28B, VTFET 33, and VTFET 34 with top S/D 41 over fin 22B and under etch stop 35. As depicted. fin 22B can reside on a lower device layer of the semiconductor structure than fin 22T. In semiconductor structure 500, VTFET 33 is adjacent to and above VTFET 34 where the horizontal distance or offset between gate 23T in VTFET 33 and gate 23B in VTFET 34 is ½ CGP.

In FIG. 5, VTFET 33 includes output connection 28T contacting to wire 29, top S/D 41, fin 22T on bottom S/D 31, and gate 23T. As depicted in FIG. 5, VTFET 34 includes output connection 28B connecting to wire 29, etch stop 35 above top S/D 41, fin 22B, gate 23B, and bottom S/D 31 over ground 24.

Etch stop 35 is an optional element of VTFET 34. As depicted, top S/D 41 is an enlarged contact landing pad. The enlarged contact landing pad (e.g., top S/D 41) under etch stop 35 eases VTFET 34 manufacture and aids in improving device yields. The enlarged contact landing pads are an optional feature of the semiconductor structure depicted in FIG. 5. Forming etch stop 35, also an optional element of the present invention aids in the formation of the enlarged contact landing pad for top S/D 41.

Figure 6:
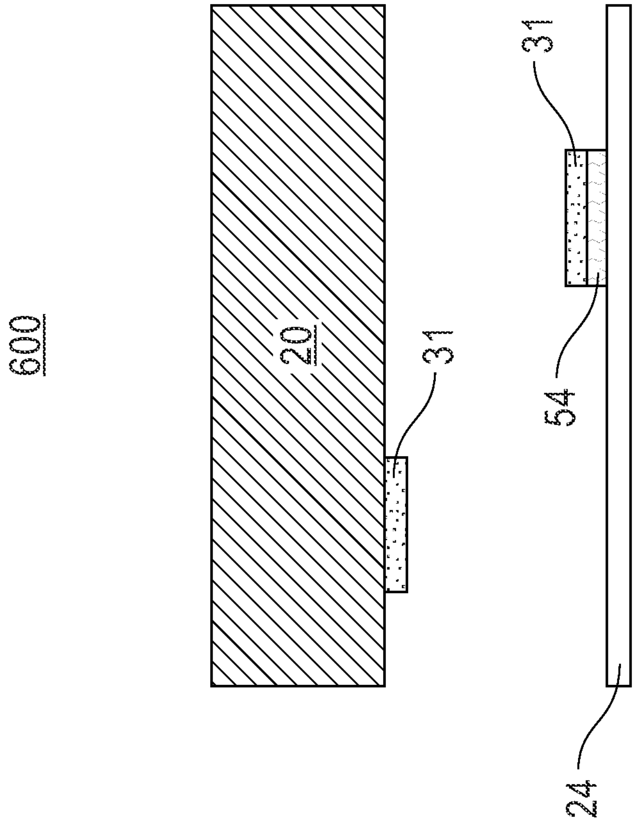
FIG. 6 is a cross-sectional view of the semiconductor structure through X3-X3 of the inverter depicted in FIG. 3 in accordance with an embodiment of the present invention.

FIG. 6 is a cross-sectional view 600 through X3-X3 of the inverter depicted in FIG. 3 in accordance with an embodiment of the present invention. As depicted, FIG. 6 includes Vdd 20, ground connection 54, bottom S/D 31 under Vdd 20 and bottom S/D 31 over ground connection 54 and ground 24. In cross-sectional view 600 through X3-X3 of the inverter of FIG. 3, Vdd 20 resides above ground 24. In some embodiments, Vdd 20 is a Vdd power rail.

Figure 7:
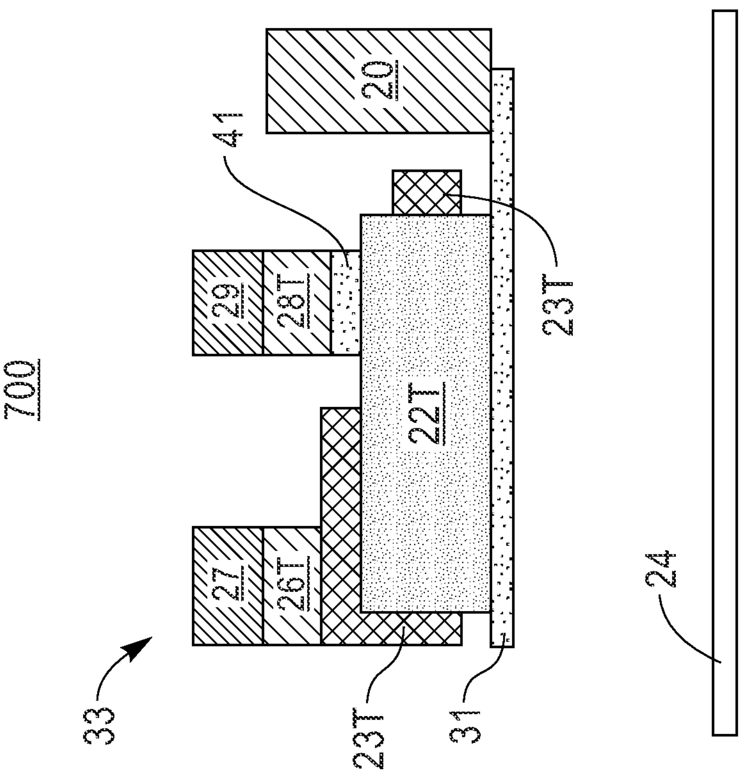
FIG. 7 is a cross-sectional view of the semiconductor structure through Y1-Y1 of the inverter depicted in FIG. 3 in accordance with an embodiment of the present invention.

FIG. 7 is a cross-sectional view 700 through Y1-Y1 of the inverter depicted in FIG. 3 in accordance with an embodiment of the present invention. As depicted, FIG. 7 includes VTFET 33, wire 27, wire 29, Vdd 20 above a portion of ground 24 which is below VTFET 33. VTFET 33 includes bottom S/D 31 under fin 22T, gate 23T on and around a portion of fin 22T, gate contact 26T on gate 23T connecting to wire 27, top S/D 41 over a portion of fin 22T and on output connection 28T that connects to wire 29. FIG. 7 depicts the portion of the inverter as the inverter extends along through fin 22T and over ground 24 (e.g., cross-sectional view 700 bisects or is through VTFET 33). Additionally, semiconductor structure of FIG. 7 depicts an example of a contact over active area also, known as a contact or a gate contact over an active gate (COAG) where a contact such as gate contact 26T can be formed to gate 23T above the fin 22T on VTFET 33. As known to one skilled in the art, COAG can reduce the cell area of the vertical transport field-effect transistor (e.g., can reduce the device size).

Figure 8:
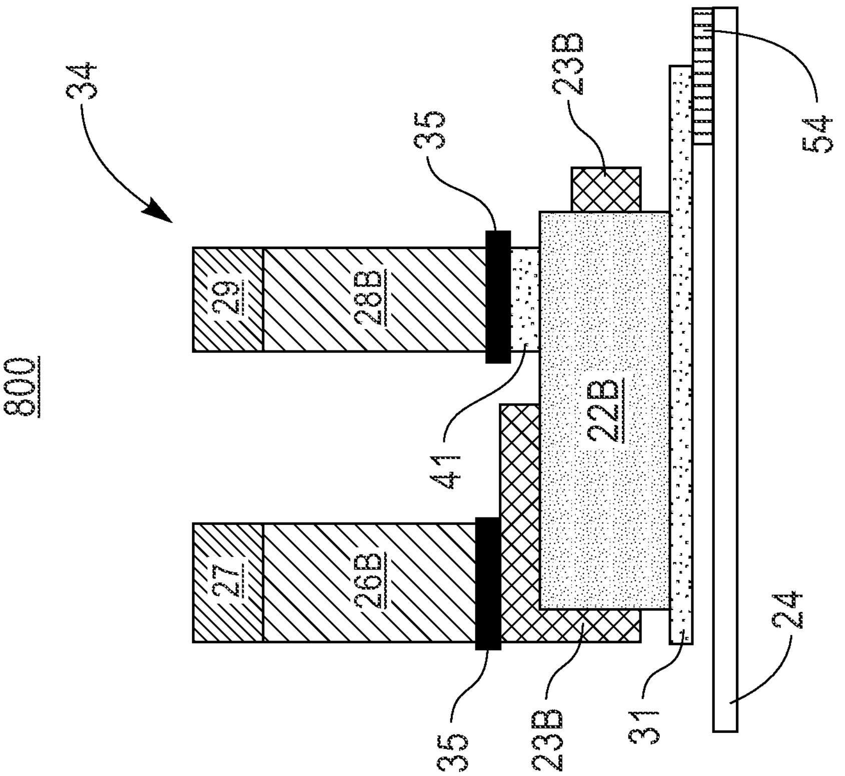
FIG. 8 is a cross-sectional view of the semiconductor structure through Y2-Y2 of the inverter depicted in FIG. 3 in accordance with an embodiment of the present invention.

FIG. 8 is a cross-sectional view 800 through Y2-Y2 of the inverter illustrated in FIG. 3 in accordance with an embodiment of the present invention. As depicted. FIG. 8 includes wire 27, wire 29, ground connection 54, ground 24, VTFET 34 with top S/D 41 under optional etch stop 35 on the right side of VTFET 34, bottom S/D 31, gate 23B on and around a portion of fin 22B, gate contact 26B above etch stop 35 on a left portion of gate 23B, gate contact 26B connecting to wire 27, and output connection 28B on the rightmost etch stop 35. Output connection 28B connects to wire 29. In FIG. 8, VTFET 34 is above and connected to ground 24. As previously discussed, top S/D 41 can be an enlarged landing pad under optional etch stop 35 where the enlarged landing pad and etch stop 35 aid in the formation of output connection 28B (e.g., can provide improved yields for output connection 28B formation). In some embodiments, etch stop 35 acts as an intermediate contact with enlarged landing pads for gate contact 26B and output connection 28B. As depicted in FIG. 8, etch stop 35 is under gate contact 26 and output connection 28B.

FIG. 8 depicts VTFET 34 as VTFET 34 extends along fin 22B. VTFET 34 connects to ground 24 by ground connection 54. Similar to the semiconductor structure depicted in FIG. 7, the semiconductor structure depicted in FIG. 8 also allows COAG where a contact such as gate contact 26B can be formed to gate 23B above the fin 22B in the active area of VTFET 34. Therefore, in various embodiments, COAG is provided in VTFET 33 on fin 2T (e.g., the top fin) and can be provided on the lower-level semiconductor device layer depicted as VTFET 34 of the inverter. Additionally, as depicted, wiring over each of active fins is open for cell-to-cell connection.

Figure 10A:
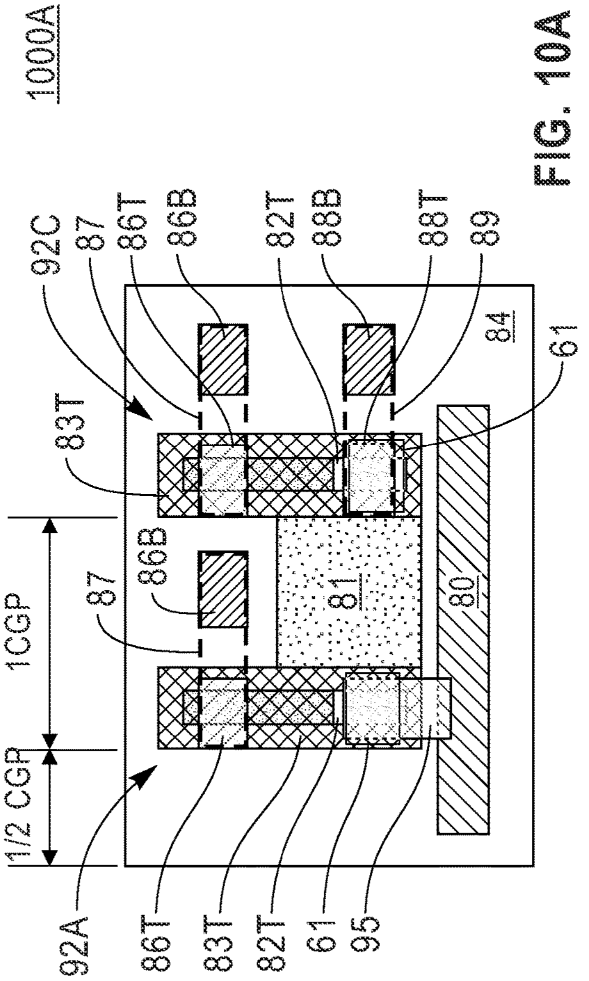
FIG. 10A is a top view of the single strength transistor structure of FIG. 9 in accordance with an embodiment of the present invention.
Figure 10B:
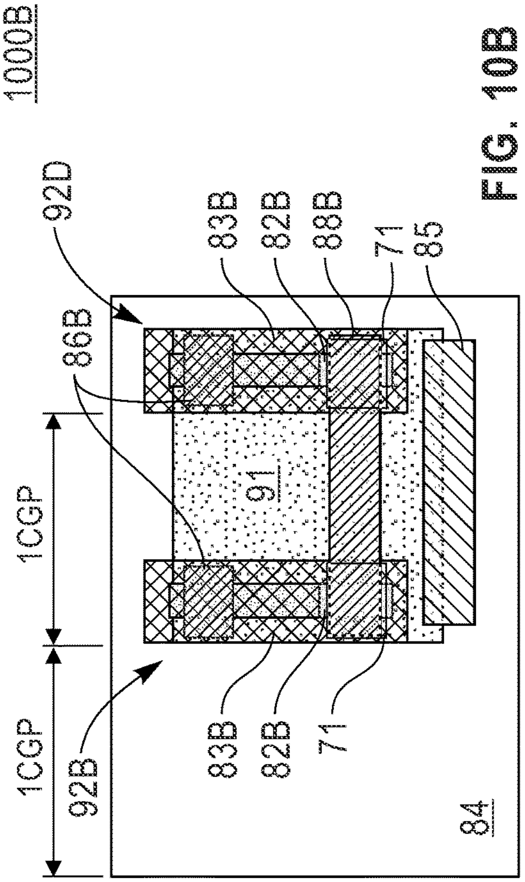
FIG. 10B is a bottom view of the single strength transistor structure for FIG. 9 in accordance with an embodiment of the present invention.
Figure 9:
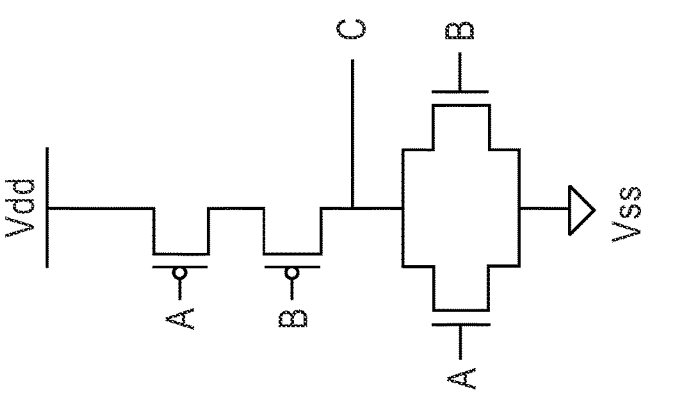
FIG. 9 is a circuit schematic of a single transistor strength device composed of a two input NOR circuit in accordance with an embodiment of the present invention.

FIGS. 9, 10A, and 10B illustrate three views (e.g., a circuit schematic, a top view, and a bottom view) of four VTFETs formed on two different semiconductor layers creating a two input NOR circuit using two PFET VTFETs (i.e., VTFET 92A and VTFET 92C depicted in FIG. 10A) connected in series in the upper semiconductor layers and two NFET VTFETs (i.e., VTFET 92B and VTFET 92D depicted in FIG. 10B) connected in parallel in the lower-level semiconductor layers. As depicted in FIGS. 10A and 10B, VTFET 92A and VTFET 92C (the top PFET VTFETs) are each offset by ½ CGP from VTFET 92B and VTFET 92D (the adjacent PFET VTFETs), respectively, that reside on a fin in a lower semiconductor layer than VTFET 92A and VTFET 92C.

The four VTFETs forming a two input NOR circuit of FIG. 9, as depicted in FIGS. 10A and 10B cover or use a two CGP horizontal space in the combined surfaces of FIG. 10A and FIG. 10B when FIG. 10A is overlayed on FIG. 10B. In one example, the area of a two input NOR circuit of FIG. 9 as depicted later in FIGS. 10A and 10B can be 80 nm (cell height) by 80 nm when one CGP is 40 nm. In other examples, the area of a two input NOR circuit can be different.

FIG. 9 is a circuit schematic 900 of a single transistor strength device composed of a two input NOR circuit in accordance with an embodiment of the present invention. Circuit schematic 900 depicts an example of a 1× or single strength transistor composed of a two input NOR circuit that are formed using four VTFETs. The a two input NOR circuit, as depicted in circuit schematic 900, is composed of two PFET VTFETs connected in series and two NFET VTFETs connected in parallel. The two PFET VTFETs are formed in upper semiconductor layers and are depicted in more detail later in FIG. 10A. The two NFET VTFETs are formed below PFET VTFETs with a ½ CGP offset from each of the PFET VTFETS and are depicted in more detail later in FIG. 10B. In other embodiments, the top VTFET devices are NFET VTFETs and the bottom two VTFETs are PFET VTFETs or top VTFET devices are a mix of NFET and PFET devices and bottom VTFETs are a mix of NFET and PFET devices.

As depicted, FIG. 9 includes supply voltage, labeled Vdd, connected to the first PFET VTFET. The first PFET VTFET receives input signals A, as depicted. In FIG. 9, the first PFET VTFET is connected in series to the second PFET VTFET. The second PFET VTFET receives input signals B and is connected to the first and second NFETs VTFET in FIG. 9. The first NFET VTFET, as depicted in FIG. 9, is connected in parallel with the second NFET VTFET where the first NFET VTFET receives input signals A and the second NFET VTFET receives input signals B. As depicted in FIG. 9, the output of the second PFET VTFET and both NFET VTFET outputs are connected to form output signal C. The two NFET VTFETs connect to the ground voltage or ground which is labeled Vss in FIG. 9.

The first PFET VTFET in FIG. 9 is depicted later as PFET VTFET 92A in FIG. 10A and the second PFET VTFET in FIG. 9 is depicted later as PFET VTFET 92C in FIG. 10A. Also, depicted later in FIG. 10B is the first NFET VTFET which is labeled 92B in FIG. 10B and the second NFET VTFET which is labeled 92D in FIG. 10B.

FIG. 10A is isometric top view 1000A of the single strength transistor of FIG. 9 composed of a two input NOR circuit in accordance with an embodiment of the present invention. As depicted, isometric top view 1000A includes two portions of wire 87, wire 89, ground 84, Vdd 80, contact 95, two of gate contacts 86T, two gate contacts 86B, output connection 88T, output connection 88B, PFET VTFET 92A, and PFET VTFET 92C. PFET VTFET 92A and PFET VTFET 92C are above and offset by ½ CGP from NFET VTFET 92B and NFET VTFET 92D in a lower semiconductor layer. NFET VTFET 92C and NFET VTFET 92D are depicted later in FIG. 10B. In FIG. 10A, PFET VTFET 92A and PFET VTFET 92C in the same semiconductor layer are separated by a CGP of 1.

In FIG. 10A, PFET VTFET 92A is composed of gate 83T on fin 82T that is on bottom S/D 81 with top S/D 61 above fin 82T. PFET VTFET 92A receives signal input A (depicted in FIG. 9) in gate contact 86T from a leftmost portion of wire 87. Another rightmost portion of wire 87 also connects gate contact 86T with gate contact 86B. PFET VTFET 92A can send output signal C discussed with respect to FIG. 9 to PFET VTFET 92C via shared bottom S/D 81 to output connection 88T associated with PFET VTFET 92C. As discussed later with respect to FIG. 10B, gate contact 86B provides signal input A to NFET VTFET 92B residing in the lower semiconductor layers. Contact 95 connects top S/D 61 to Vdd 80 (Vdd 80 can also be known as the Vdd power rail).

In FIG. 10A, PFET VTFET 92C is depicted to the right of PFET VTFET 92A. PFET VTFET 92C, as depicted, is composed of the rightmost gate 83T on the rightmost fin 82T with bottom S/D 81 under the rightmost fin 82T and top S/D 61 above fin 82T. In various embodiments, top S/D 61 in PFET VTFET 92A connects to contact 95 which connects to Vdd 80 (Vdd power rail). PFET VTFET 92B and PFET VTFET 92A, as previously discussed with respect to FIG. 9, are connected in series.

Gate contact 86T in PFET VTFET 92C is above the rightmost gate 83T and receives signal input B. Gate contact 86T connects to the second portion of wire 87. Gate contact 86T in PFET VTFET 92C is connected through wire 87, as depicted, to gate contact 86B on gate 83B of NFET VTFET 92D (not depicted in FIG. 10A). Gate contact 86B can provide signal input B to NFET VTFET 92D (depicted in FIG. 10B). As depicted, the gate contact 86B resides half-way between PFET VTFET 92A and PFET VTFET 92C where, as depicted, PFET VTFET 92A and PFET VTFET 92C are separated by 1 CGP. In other words, each of gate contact 86T is horizontally distanced by ½ CGP from at least one outside edge of gate 83T in PFET VTFET 92A or PFET VTFET 92C. As previously discussed, PFET VTFET 92A is connected in series to PFET VTFET 92C such that the output of PFET VTFET 92A feeds into PFET VTFET 92C and the output of PFET VTFET 92C feeds into output connection 88T. Output connection 88T connects by wire 89 to output connection 88B.

Also, illustrated in FIG. 10A, is a 1 CGP distance is between gate 83T in PFET VTFET 92A and gate 83T in PFET VTFET 92C that reside on the same semiconductor layer. PFET VTFET 92A has a horizontal distance of ½ CGP from the edge of the box around FIG. 10A. The box around FIG. 10A is directly above the box around FIG. 10B. In other words, FIG. 10A is directly above FIG. 10B and the combination of VTFET 92A and VTFET 92C in the upper semiconductor device layers depicted in FIG. 10A and VTFET 92B and VTFET 92D in the lower semiconductor device layer depicted in FIG. 10B forms a two input NOR circuit of FIG. 9.

FIG. 10B is bottom isometric view 1000B of the single strength transistor of FIG. 9 composed of a two input NOR circuit in accordance with an embodiment of the present invention. As depicted, FIG. 10B includes ground connection 85, ground 84, NFET VTFETs 92B and 92D with gate contacts 86B and output connection 88B. As previously discussed, NFET VTFET 92B and NFET VTFET 92D are formed on a lower semiconductor layer than PFET VTFET 92A and PFET VTFET 92D (e.g., PFET VTFET 92A and PFET VTFET 92C are formed in a semiconductor layer directly above the semiconductor layer containing NFET VTFET 92B and NFET VTFET 92D). As depicted, VTFET 92B and VTFET 92D with 1 CGP space between them and are offset horizontally by ½ CGP from VTFET 92A and VTFET 92C, respectively.

As depicted in FIG. 10B, a CGP of one separates the leftmost edge of gate 83B of NFET VTFET 92B from gate 83B of NFET VTFET 92D. Additionally, as illustrated, NFET VTFET 92B is 1 CGP from the edge of the box that indicates where the next NFET VTFET could be formed. As previously stated, the edge of the box in FIG. 10B is directly below and aligned to the box in FIG. 10A. In this case, the horizontal distance or offset from PFET VTFET 92A to NFET VTFET 92B is ½ CGP (i.e., 1 CGP depicted in FIG. 10B minus ½ CGP depicted in FIG. 10A).

In FIG. 10B, NFET VTFET 92B is to the left of NFET VTFET 92D. NFET VTFET 92B on bottom S/D 91 is composed of gate 83B on the leftmost fin 82B and top S/D 71. The leftmost of gate contact 86B receives signal input A from wire 87, as discussed above. Output connection 88B is on a portion of NFET VTFET 92B and connects to a portion of NFET VTFET 92D as depicted. Output connection 88B can receive output signals from top S/Ds 71.

Also, as depicted in FIG. 10B, NFET VTFET 92D is composed of gate 83B on the rightmost fin 82B above bottom S/D 91. Fin 82B is under a top S/D 71 where the rightmost of gate contact 86B resides on gate 83B of NFET VTFET 92D and receives signal input B (e.g., provided by wire 87 above in FIG. 10A). As previously discussed with respect to FIG. 9, NFET VTFET 92B and NFET VTFET 92D are connected in parallel and both output to output connection 88B.

Figure 11:
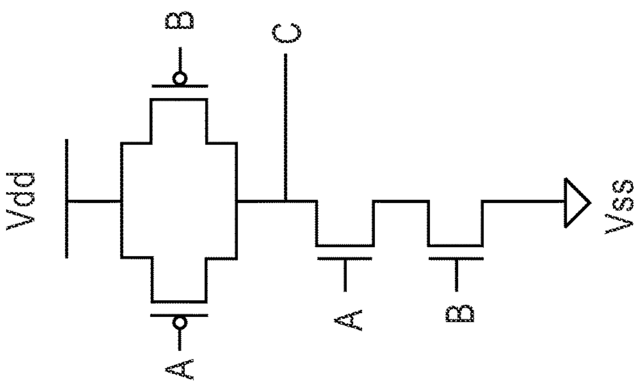
FIG. 11 is a circuit schematic of a single transistor strength transistor composed of a two input NAND circuit in accordance with an embodiment of the present invention.

FIG. 11 is circuit schematic 1100 of a single transistor strength device composed of a two input NAND circuit in accordance with an embodiment of the present invention. Circuit schematic 1100 depicts an example of a 1× or single strength transistor composed of a two input NAND circuit that are formed using four VTFETs depicted later as PFET VTFET 122A, PFET VTFET 122C, NFET VTFET 122B, and NFET VTFET 122D in FIGS. 12A and 12B. The a two input NAND circuit, as depicted in circuit schematic 1100, are composed of two PFET VTFETs connected in parallel and two NFET VTFETs connected in series. The two PFET VTFETs are formed in the upper semiconductor layers and are depicted in more detail later in FIG. 12A. The two NFET VTFETs are formed below the two PFET VTFETs and are horizontally offset from the two PFET VTFETs by a horizontal distance of ½ CGP as discussed with respect to FIGS. 12A and 12B. The two NFET VTFETs are depicted in more detail later in FIG. 12B.

As depicted, FIG. 11 includes supply voltage labelled Vdd connects to the first PFET VTFET with input signal A and to the second PFET VTFET with input signal B where, as depicted, the first PFET VTFET and the second PFET VTFET are connected in parallel. The first NFET VTFET, as depicted in FIG. 11, receives input signals A and the second NFET VTFET receives input signals B where, as depicted in FIG. 11, the first and the second NFET VTFET are connected in series. As depicted in FIG. 11, the output from each of the two PFET VTFETs and the output from the first NFET VTFET is sent by the second NFET VTFET to output signal C since, as previously discussed, the first NFET VTFET is connected in series with the second NFET VTFET. In other words, output signal C includes the output from each of the four VTFETs. The first NFET VTFET connects to ground voltage which is labelled Vss in FIG. 11.

The first PFET VTFET in FIG. 11 is depicted later as PFET VTFET 122A in FIG. 12A and the second PFET VTFET in FIG. 11 is depicted later as PFET VTFET 122C in FIG. 12A. Also, depicted later in FIG. 12B is the first NFET VTFET which is labeled 122B in FIG. 12B and the second NFET VTFET which is labeled 122D in FIG. 12B.

Figure 12A:
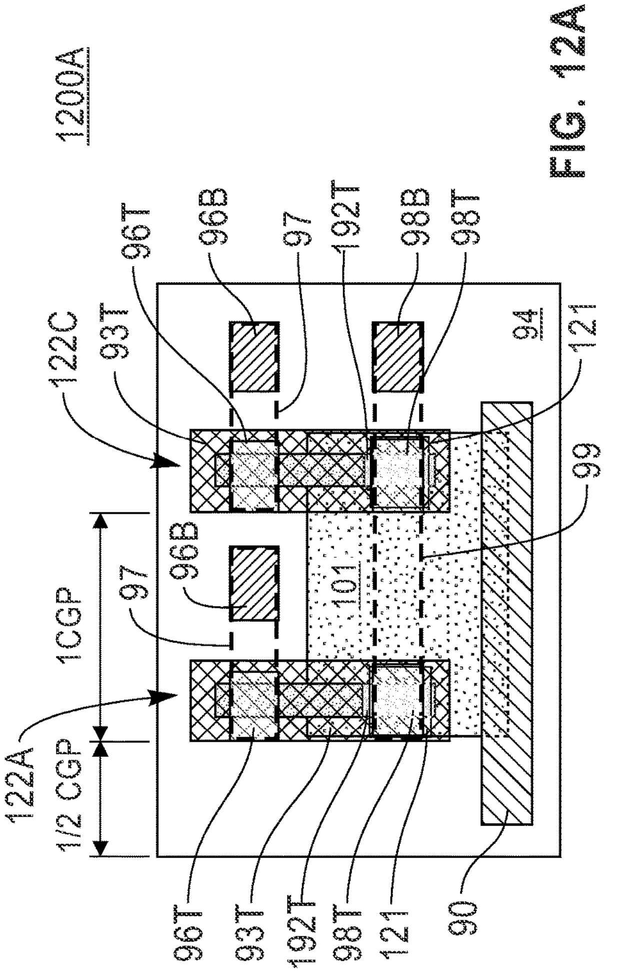
FIG. 12A is a top view of the single strength transistor structure of FIG. 11 in accordance with an embodiment of the present invention.

FIG. 12A is a top isometric view 1200A of the single strength transistor with a two input NAND circuit depicted in FIG. 11 in accordance with an embodiment of the present invention. Top view 1200A is an isometric top view through various semiconductor layers (e.g., through the interlayer dielectric materials). As depicted, top view 1200A includes ground 94, Vdd 90, two of gate contacts 96B, two of output connection 98T, gate contacts 96T, output connection 98B, two portions of wire 97, wire 99, PFET VTFET 122A, and PFET VTFET 122C. PFET VTFET 122A and PFET VTFET 122C are connected in parallel as depicted in FIG. 11 and where top S/D 121 on PFET VTFET 122A and output connection 98T on PFET VTFET 122C are connected by wire 99. PFET VTFET 122A and PFET VTFET 122D reside in semiconductor layers that are above NFET VTFET 122B and NFET VTFET 122D. Output signal C, as previously discussed with respect to FIG. 9, comes from wire 99 and includes the output from the two of output connection 98T and output connection 98B that are depicted in FIG. 12A.

Also, illustrated in FIG. 12A is a 1 CGP distance between PFET VTFET 122A and PFET VTFET 122C and a ½ CGP distance from PFET VTFET 122A and the edge of the box depicting FIG. 12A. Similar to FIG. 10A and FIG. 10B, FIG.

Figure 12B:
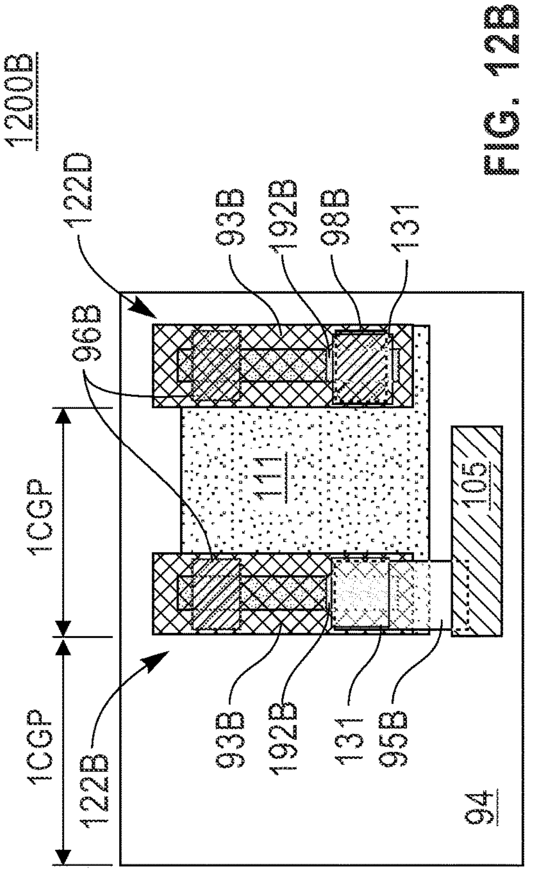
FIG. 12B is a bottom view of the single strength transistor structure for FIG. 11 in accordance with an embodiment of the present invention.

12A and FIG. 12B depict views of different semiconductor layers that are directly above and below each other where the edges of the box around FIG. 12A and the edges of the box around FIG. 12B are vertically aligned and directly above and below each other.

In FIG. 12A, PFET VTFET 122A on bottom S/D 101 is composed of gate 93T on the leftmost fin 192T and top S/D 121 above fin 92T. The leftmost gate contact 96T receives signal input A from a portion of wire 97 where the second portion of wire 97 connects to gate contact 96B. In PFET VTFET 122A, top S/D 121 is under output connection 98T. Output signal C depicted FIG. 9 receives the output from the two output connections 98T and output connection 98B from NFET VTFET 122D which are all connected through wire 99 as depicted in FIG. 12A.

Also, in FIG. 12A, PFET VTFET 122C resides to the right of PFET VTFET 122A. As depicted, PFET VTFET 122C includes gate 93T on the rightmost fin 192T on bottom S/D 101 with a portion of the rightmost of gate contact 96T on gate 93T. As depicted in FIG. 12A, gate contact 96B connects to a portion of interconnect wire 97. As depicted in FIG. 12A and FIG. 11, the rightmost gate contact 96T that is over PFET VTFET 122C receives signal input B from interconnect wire 97. PFET VTFET 122C sends output to output connection 98T using interconnect wire 99 that connects to output connection 98T from PFET VTFET 122C as PFET VTFET 122A and PFET VTFET 122C are connected in parallel (i.e., as depicted and discussed previously with respect to FIG. 11). Additionally, as depicted in FIG. 12A, wire 99 also connects to output connection 98B. As depicted, top S/D 121 in each of PFET VTFET 122A and PFET VTFET 122C connects to Vdd 90, which can be a shared Vdd power rail.

FIG. 12B is a bottom isometric view 1200B of the single strength transistor with a two input NAND circuit of FIG. 11 in accordance with an embodiment of the present invention. As depicted, FIG. 12B includes ground connection 105, ground 94, contact 95B, NFET VTFET 122B, and NFET VTFET 122D with gate contacts 96B and output connection 98B. FIG. 12B illustrates NFET VTFET 122B and NFET VTFET 122D that are formed on a lower semiconductor level than PFET VTFET 122A and PFET VTFET 122C depicted in FIG. 12A.

In FIG. 12B, NFET VTFET 122B on bottom S/D 111 includes gate 93B on the leftmost of fin 192B, gate contact 96B receiving signal input A and contact 95B over the top S/D 131 connecting to ground connection 105 which connects to ground 94. In some embodiments, ground connection 105 is a bottom conduction plane. As discussed with reference to FIG. 11, NFET VTFET 122B and NFET VTFET 122D are connected in series and output connection 98B connects to NFET VTFET 122D as depicted.

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure comprising:
a first plurality of vertical transport field-effect transistors (VTFETs) in a lower semiconductor layer; and
a second plurality of VTFETs in an upper semiconductor layer, wherein:
the second plurality of VTFETs is offset from the first plurality of VTFETs;
a first VTFET of the first plurality of VTFETs has a first contact;
a second VTFET of the second plurality of VTFETs has a second contact;
a first interconnect is above both the first VTFET and the second VTFET; and
each of the first contact and the second contact has a single, direct, straight, vertical connection to the first interconnect.

2. The semiconductor structure of claim 1, wherein the second plurality of VTFETs in the upper semiconductor layer are each horizontally offset by one-half of a contacted gate pitch from the first plurality of VTFETs in the lower semiconductor layer.

3. The semiconductor structure of claim 1, wherein the second plurality of VTFETs in the upper semiconductor layer each have a horizontal distance of one contacted gate pitch to an adjacent VTFET of the second plurality of VTFETs in the upper semiconductor layer.

4. The semiconductor structure of claim 1, wherein the first plurality of VTFETs in the lower semiconductor layer each have a gate contact over an active gate (COAG).

5. The semiconductor structure of claim 1, wherein in the second plurality of VTFETs there is at least one gate contact over an active gate (COAG).

6. The semiconductor structure of claim 1, wherein the second plurality of VTFETs in the upper semiconductor layer are each horizontally offset from the first plurality of VTFETs in the lower semiconductor layer by a range between 0.3 to 0.7 contacted gate pitch.

7. A semiconductor structure comprising:
a first vertical transport field-effect transistor (VTFET) in a lower semiconductor layer, wherein the first VTFET has a first straight, vertical contact; and
a second VTFET in an upper semiconductor layer, wherein:
the second VTFET has a second straight, vertical contact; and
the first VTFET is offset from the second VTFET by one-half of a contacted gate pitch of the second VTFET.

8. The semiconductor structure of claim 7, wherein the first VTFET is a first type of field-effect transistor and the second VTFET is a second type of field-effect transistor.

9. The semiconductor structure of claim 7, wherein the offset is one-half of a contacted gate pitch of the second VTFET.

10. The semiconductor structure of claim 7, wherein the offset is a range between 0.3 to 0.7 of a contacted gate pitch of the second VTFET.

11. A semiconductor structure comprising:
one or more vertical transport field-effect transistors (VTFETs) in an upper semiconductor layer, wherein the one or more VTFETs in the upper semiconductor layer are separated by one contacted gate pitch; and one or more VTFETs in a lower semiconductor layer, wherein:

the one or more VTFETs in the lower semiconductor layer are separated by one contacted gate pitch;

the one or more VTFETs in the lower semiconductor layer have straight, vertical contacts connecting to interconnect wiring above the one or more VTFETs in the upper semiconductor layer; and the one or more VTFETs in the upper semiconductor layer are offset from the one or more VTFETs in the lower semiconductor layer.

12. The semiconductor structure of claim 11, wherein the one or more VTFETs in the lower semiconductor layer each has a contact over an active gate (COAG).

13. The semiconductor structure of claim 11, wherein the one or more VTFETs in the lower semiconductor layer is a first type of field-effect transistor and wherein the one or more VTFETs in the upper semiconductor layer is a second type of field-effect transistor.

14. The semiconductor structure of claim 11, wherein the offset is in a range between 0.3 to 0.7 of contacted gate pitch.

15. A semiconductor structure comprising:

a first pair of vertical transport field-effect transistors (VTFETs) in a lower semiconductor layer; and a second pair of VTFETs in an upper semiconductor layer, wherein each of the second pair of VTFETs in the upper semiconductor layer is horizontally offset by half of a contacted gate pitch from at least one VTFET in the lower semiconductor layer, wherein:

the first pair of VTFETs in the lower semiconductor layer are a first type of VTFET connected in parallel;

the second pair of VTFETs in the upper semiconductor layer are a second type of VTFET connected in series; and each of the first pair of VTFETs in the lower semiconductor layer and each of the second pair of VTFETs in the upper semiconductor layer have a straight, vertical contact to an interconnect wire above the second pair of VTFETs.

16. The semiconductor structure of claim 15, further comprising:

a bottom conduction plane connecting to at least one of the first pair of the first type of VTFETs in the lower semiconductor layer; and a power rail above and connected to at least one of the second pair of the second type of VTFETs in the upper semiconductor layer.

17. The semiconductor structure of claim 16, wherein the first pair of VTFETs in the lower semiconductor layer and the second pair of VTFETs in the upper semiconductor layer form a two input NOR circuit.

18. A semiconductor structure comprising:

a first pair of vertical transport field-effect transistors (VTFETs) in a lower semiconductor layer; and a second pair of VTFETs in an upper semiconductor layer, wherein each of the second pair of VTFETs in the upper semiconductor layer is horizontally offset by half of a contacted gate pitch from at least one VTFET in the lower semiconductor layer, wherein;

the first pair of VTFETs in the lower semiconductor layer are a first type of VTFET connected in series;

the second pair of VTFETs in the upper semiconductor layer are a second type of VTFET connected in parallel; and each of the first pair of VTFETs in the lower semiconductor layer and each of the second pair of VTFETs in the upper semiconductor layer have a straight, vertical contact to an interconnect wire above the second pair of VTFETs.

19. The semiconductor structure of claim 18, wherein the first pair of VTFETs in the lower semiconductor layer and the second pair of VTFETs in the upper semiconductor layer form a two input NAND circuit.

* * * * *